(12) United States Patent
Santosa et al.

(10) Patent No.: US 6,819,150 B1
(45) Date of Patent: Nov. 16, 2004

(54) METHOD AND APPARATUS FOR QUICK CLOCK SWAPPING USING MUCH SLOWER ASYNCHRONOUS CLOCK FOR POWER SAVINGS

(75) Inventors: Handiono Santosa, San Diego, CA (US); Simon Kim, Glendale, CA (US); Sheng Hung Wang, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 588 days.

(21) Appl. No.: 09/957,144

(22) Filed: Sep. 19, 2001

(51) Int. Cl.$^7$ ................................................. H03L 7/00
(52) U.S. Cl. ..................................... 327/141; 327/144
(58) Field of Search .................... 327/99, 141–142, 327/144, 172, 176, 199–202, 212–213, 215–219, 225, 407; 365/233, 233.5

(56) References Cited

U.S. PATENT DOCUMENTS

| | | | | |
|---|---|---|---|---|
| 6,269,043 B1 * | 7/2001 | Batcher | ...................... | 365/227 |
| 6,292,038 B1 * | 9/2001 | Stachura et al. | ............. | 327/145 |
| 6,429,698 B1 * | 8/2002 | Young | .......................... | 327/99 |
| 6,453,425 B1 * | 9/2002 | Hede et al. | ................. | 713/501 |
| 6,472,909 B1 * | 10/2002 | Young | .......................... | 327/99 |

* cited by examiner

Primary Examiner—My-Trang Nu Ton
(74) Attorney, Agent, or Firm—John L. Rogitz

(57) ABSTRACT

A power reduction device which includes a first clocking device for generating a first clocking signal, a second clocking device for generating a second clocking signal, a synchronizer device for receiving the first and second clocking signals and being responsive to a first select signal and to a second control signal wherein upon receipt of either of the select or control signals, the synchronizing device generating a synchronized signal without a glitch therefrom wherein the synchronized signal corresponding to either the first or second clocking signals.

18 Claims, 4 Drawing Sheets

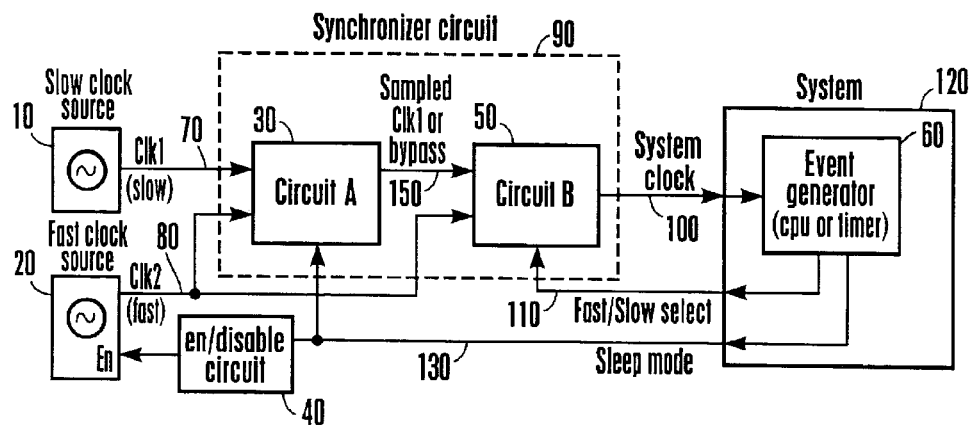
Figure 1
Figure 2
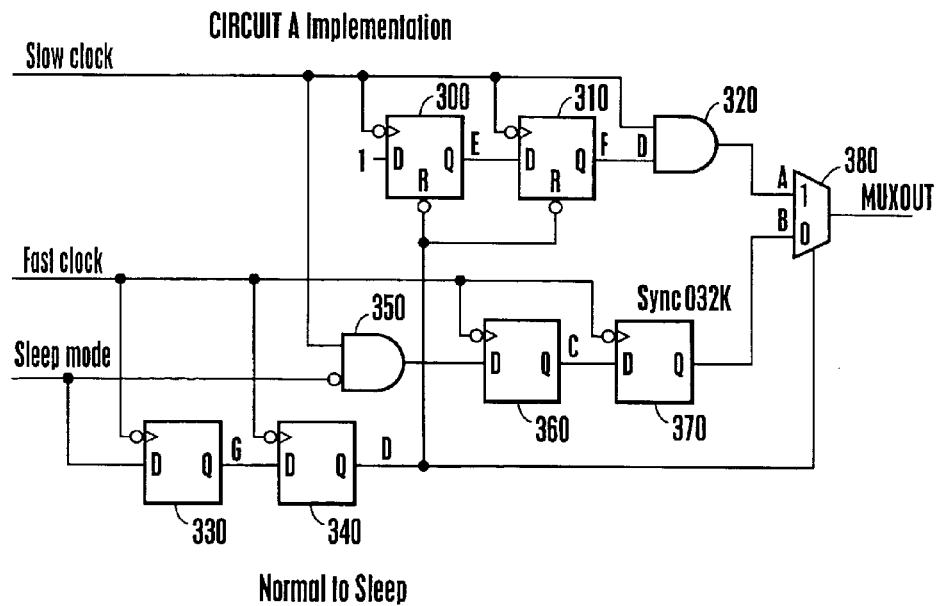

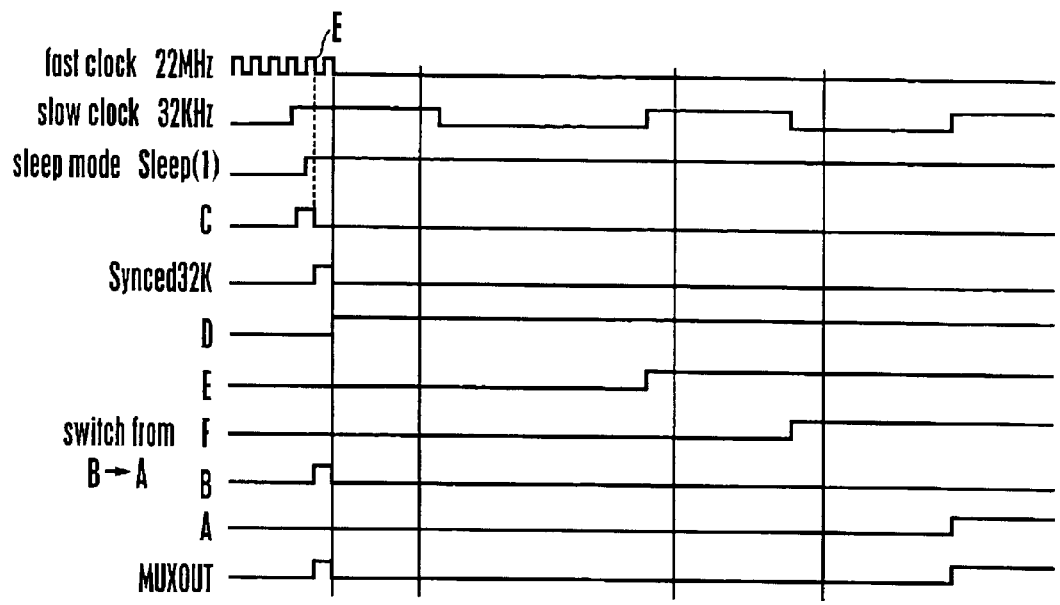
Figure 3
Figure 4
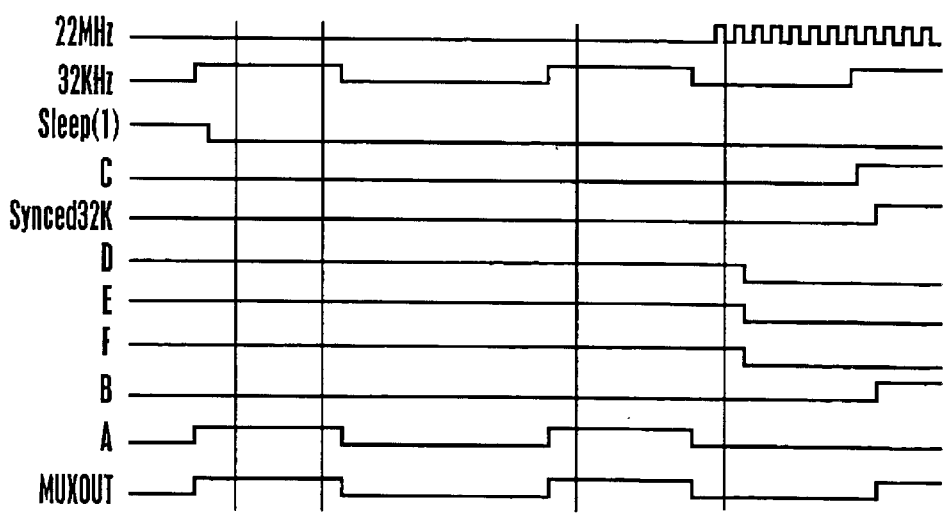

METHOD AND APPARATUS FOR QUICK CLOCK SWAPPING USING MUCH SLOWER ASYNCHRONOUS CLOCK FOR POWER SAVINGS

A portion of the disclosure of this patent document contains material which is subject to copyright protection. The copyright owner has no objection to the facsimile reproduction of the patent document or the patent disclosure, as it appears in the Patent and Trademark Office patent file or records, but otherwise reserves all copyright rights whatsoever.

FIELD OF THE INVENTION

This invention relates to methods and apparatus for minimizing power consumption in electronic devices. In particular, this invention is directed to methods and apparatus for minimizing the amount of time the electronic device spends in a high power consumption mode.

BRIEF DESCRIPTION OF THE PRIOR ART

The prior art has attempted to minimize power consumption in electronic devices by having a sleep power mode wherein the power is turned off. While this type of operation conserves power, it presents the problem that the system requires wake-up time, in essence, time for transition out of this sleep mode and enter into an operation mode to be fully operational and to operate at full speed. Accordingly, there is either a delay in the operation that is required, or if there is no delay, there is a possibility that data may be lost during the wake up period. Neither of these possibilities is desirable and often neither is acceptable.

SUMMARY OF THE INVENTION

In accordance with the present invention, the above-noted problem of the prior art is resolved. The present invention provides a synchronization between an asynchronous mode clocking generator and a synchronous mode clocking generator. The circuits of the present invention switches between a high frequency clock and a lower frequency clock, in order to increase power saving.

As explained earlier, in a sleep mode, it is necessary to conserve the amount of energy as much as possible, therefore, it is desired to turn off most clocking operations and run only a smaller, critical, part of a circuit at a very low clocking speed because the lower the frequency, the less the power consumption. As such, it is needed to isolate the clocking generator device with the lowest clocking frequency during a sleep cycle.

As has been explained, the most convenient way of running at a low clocking speed is by using a "real time" clock generator, because the "real time" clock generator enables a convenient time range to synchronize the other clocking speeds as it has multiple time periods within the normal 32 kHz clock generator isolated.

The transition from either low power or "sleep" mode to a fully operation status is called "wake up" mode. Generally, in a system, when in "sleep" mode, it is necessary to use the clock source that is running very slow to run a part of the circuit that is needed to wake up the circuit.

Further, the "fast" clock and the "real time" 32 kHz clock are asynchronous to each other, also, the system clock and the 32 kHz clock are also asynchronous. Further, there remains a need to synchronize the fast clock, 32 kHz clock and the system clock.

When switching between the system clock and the 32 kHz clock, the 32 kHz clock is much slower than the system clock; therefore, during switching operations, a glitch may occur. Because the system clock is very important, if there is a glitch, the clocking signal may not function properly and a reliability issue may arise. Further, the glitch may cause the circuit itself not to function. Hence, any switching operation between the system clock and the 32 kHz clock must be done in a way to prevent the above problem.

Briefly, the circuit of the present invention waits for a clocking edge to switch from the system clock to the 32 kHz clock. Usually, at the rising edge of the 32 kHz clock, a switch from the system will be performed. Further, it is important that a switch does not occur in the middle of a clocking cycle as this can result in delays or glitches.

BRIEF DESCRIPTION OF THE DRAWINGS

The present invention satisfies the needs noted above as will become apparent from the following descriptions, when read in conjunction with the accompanying drawings.

FIG. 1 is a block diagram of the power saving mode using a slow clock source, in accordance with the present invention.

FIG. 2 is a bi-stable circuit configuration of the first stage implementation, in accordance with the present invention.

FIG. 3 is a timing diagram for FIG. 2, showing the relationships of the fast clock, slow clock and sleep mode clocking signals.

FIG. 4 is a timing diagram for the circuit of FIG. 2 showing the relationships again of the fast clock, slow clock and sleep mode clocking signals.

BRIEF DESCRIPTION OF THE PREFERRED EMBODIMENT

Figure 5:
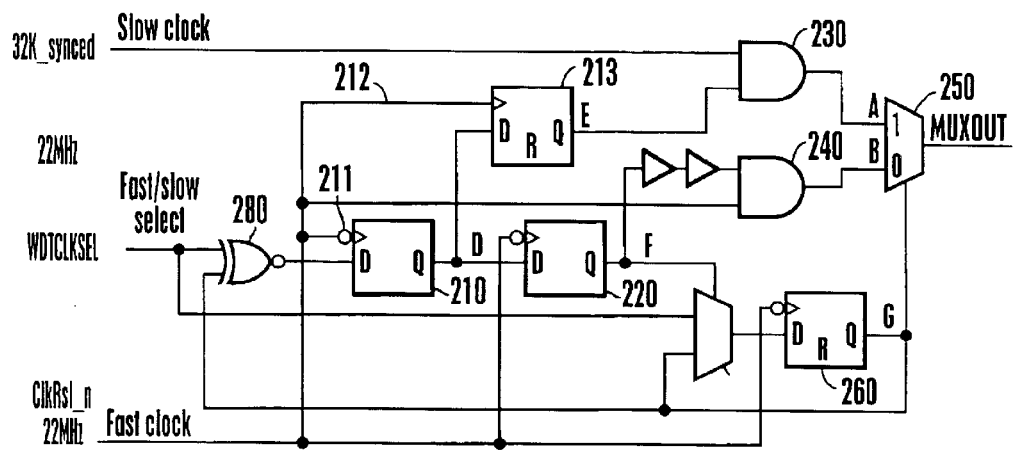
FIG. 5 is a bi-stable circuit diagram of a second stage, in accordance with the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawing.

Referring first to FIG. 1, there is shown a block diagram of the power saving management circuit in accordance with the present invention. The power saving management circuit (150) includes a free-running slow clocking source (10), and a free-running fast clocking source (20), the slow clocking source (10) generating a first clocking one (slow) signal (70), received by bi-stable circuit A (30), which is shown in greater detail in FIG. 2; the bi-stable circuit A (30) generates a sampled clock one or by-pass clocking signal (90) which is received by bi-stable circuit B (50), the bi-stable circuit is shown in greater detail in FIG. 5.

Next, the fast clocking source (20) generates a second clocking signal (80). This is a fast clocking signal, received by both circuit A (30) and circuit B (50). Further, a sleep mode signal is received by the fast clocking source 20 (130), determining when the fast clocking source is to go into sleep mode.

The system, comprises an event generator (60) which is a CPU or timer for generating the sleep mode, and fast/slow select mode (110) signals. This event generator (60) receives the system clock information (100) so as to switch the system clock to the slow clock.

In order to explain the operation of the circuit, it is first necessary to explain the normal mode of operation. In normal mode of operation, the bi-stable circuit B selects the output of the fast clocking source (20), the clocking signal two (80) as the source for the system clock. Here, circuit B is trying to synchronize the slow clock (10) with the fast clock (20). Hence, when the power-saving mode system decides to go to a sleep mode, the event generator (60) or controller needs to initiate a sequence of operations wherein the fast clock is turned off and it is necessary to use a non-synchronized clock signal.

First, the controller or CPU (60) switches the system clock to the slow clock (10). This is performed by circuit B selecting the first clocking signal (70) as the source for the system clock. The bi-stable circuit B provides a glitch-free switching from the fast clocking signal two (80) and the sampled clocking signal one (90) are synchronous.

As indicated in FIG. 5, the slow clocking signal is received by the AND gate (230), and the fast-slow clocking signal is received by the flip flop (200). There is shown a three step procedure where initially the output of the AND gate (240) for signal B is switched off, then the MUX (250) of FIG. 5 is switched to the alternate output, and the output of the AND gate (230) is switched ON or held to other signal A.

Next, the event generator or generates terms the wake-up event, which could either be a select signal generated from an internal timer or from the CPU itself.

The event generator or controller sets the mode to a sleep mode.

Further, to go to sleep, the CPU (60) programs circuit A to be bypassed. Hence, in sleep mode, the CPU (60) selects the circuit B (50) to a slow clock and then the CPU programs circuit A (30) to be by-passed.

Next, in wake mode, either the CPU or other events switches to circuit A from the by-pass or sampled clock. The CPU (60) programs circuit B (50) to switch from a sampled clock (90) to a fast clock (80).

The controller sets the mode to sleep. When this occurs, circuit A (30) provides a glitch-free switching between the sampled clock to the by-pass or sampled clock one (90), followed by turning off the fast clock source by the enable/disable circuit.

When the wake up event occurs, an event generator (60) sets the mode to normal mode. The enable/disable circuit activates the fast clock (20). After the fast clock is up and running, circuit A (30) switches back from the by-pass clock to the sampled clock.

The controller may switch the system clock to clock two by changing the state of the fast/slow select signal. Circuit B performs the clean switching there between.

Finally, bi-stable circuit A (30) and bi-stable circuit B (50) enable faster switching between a faster clock and a much slower clock. As such, there is no waiting time for the slow clock edge to make the switch. This is useful because it enables the system to quickly operate in a fast clock during a wake-up sequence.

The purpose of the clock synchronizing circuits as illustrated in FIG. 2 and FIG. 5 is to produce a glitch-free output to the system. Accordingly, to guarantee full and reliable functionality of this system, a glitch-free clock is required when the system wakes-up or goes to sleep in a low power mode. The synchronizing circuits A and B operate in the following manner with reference to FIGS. 2 and 5.

AND gate (230) gates the slow clock, and AND gate (240) gates the fast clock. The AND gate (230) is glitch free because there is a separation of the gating of both clocks. For example, AND gate (240) is glitch free because it is clocked by the falling edge of the fast clock. The MUX (250) selector only changes when both signals A and B are OFF, and therefore is glitch free.

Flip flop (260) controls the MUX (250) selection; the state of flip flop (260) can be changed setting the fast/slow input high or low to the NOR gate (220). A high on the fast/slow select input will select the slow clock and a low will select the fast clock.

Both flip flops (210 and 200) are coupled in a cascade manner to avoid metastable conditions. The fast clocking signal to flip flop (200) is asynchronous to the inverted clocking signal (211).

The gating signal, signal E, is clocked by the rising edge of the fast clock because the input is not inverted. The significance is that the gating signal does not change (i.e., transition of the gating signal) does not occur at same time of transition of slow clocking signal because the slow clock was coupled on the falling edge (see point E of FIG. 3).

Figure 6:
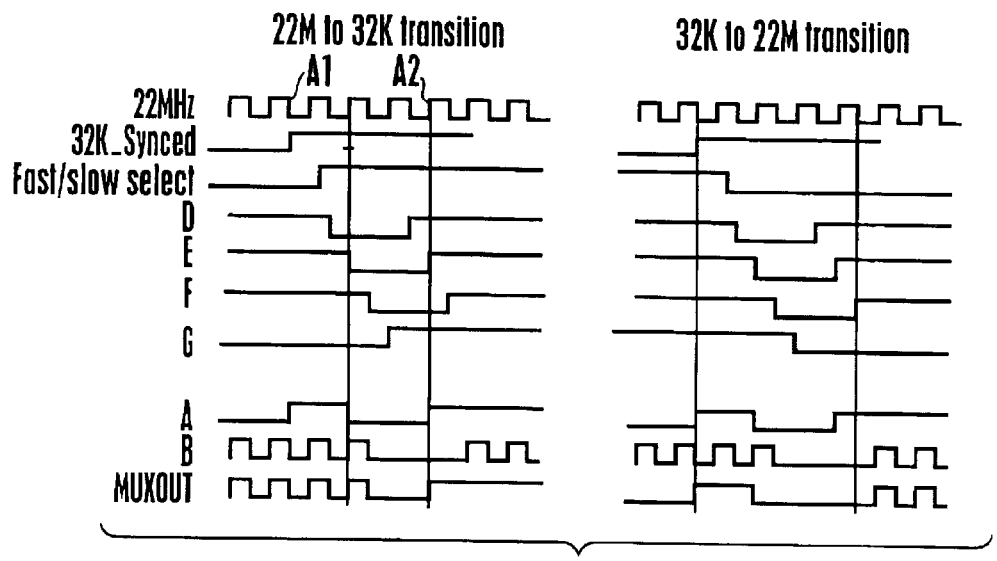
FIG. 6 is another timing diagram for the circuit of FIG. 5, showing the relationships of the fast clock to the synchronized slow clock.
Figure 7:
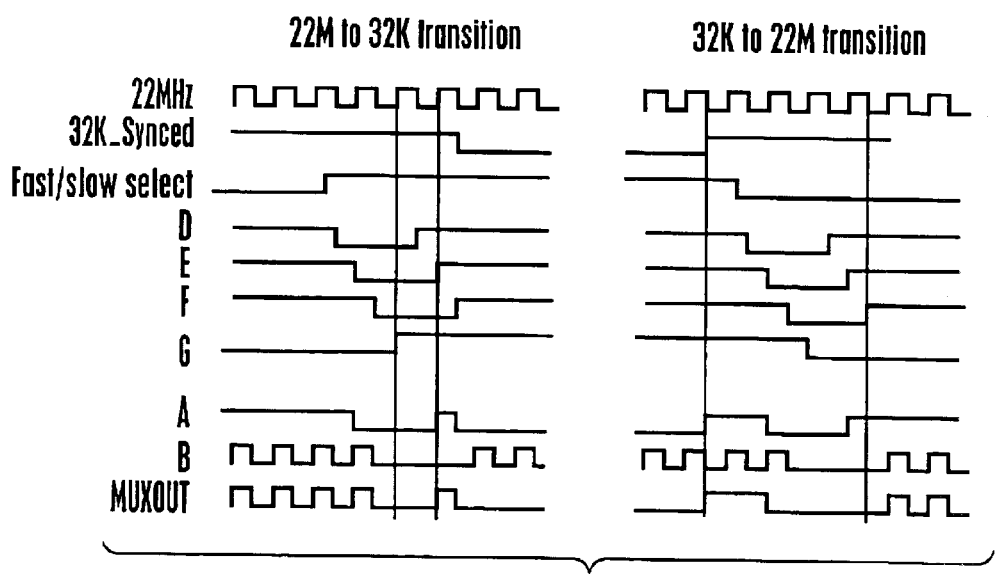
FIG. 7 is a timing diagram for FIG. 5, showing the relationship of the slow clock to the fast clock.

The slow clocking transition is shown in FIG. 6 as (A1). The slow clock is sampled on falling edge by flip flop (370) so a transition only occurs on the falling edge.

The gating signal E (FIG. 5) changes on the rising edge (A2) (FIG. 6) because a transition occurs on falling edge while A1 occurs on the rising edge, separated by half a clock cycle.

The AND gate (230) is used to switch ON/OFF the slow clock and AND gale (240) is used to switch off the FAST clock.

Signal F acts as a switching signal for the AND (240) operation. In wake mode, initially the input signal is low and then in sleep mode the input is set high. This causes flip flop (340) to go high, then MUX (380) can select input A (which is the bypassed slow clock NOT the sampled clock).

The cascaded flip flop (330) and flip flop (340) is to avoid metastability caused by the asynchronous sleep mode input relative to the fast clock (FIG. 2). Flip flop (360) and flip flop (370) are used to sample the slow clock and avoid metastability. Flip flop (306) and flip flop (310) are used.

During the wake mode, the flip flop (340) output is low which forces flip flow (300) and flip flop (310) to Low, which causes the output of AND gate (320) to be low. When flip flop (340) changes to high because the sleep mode is set to high, then after the falling edge of a slow clock, flip flop (310) will go high, which allows the bypass slow clock signal to be sent through. In summary, in sleep mode, the bypass signal is used and in wake mode the sampled signal is used.

In normal operation from wake mode to sleep mode when switching the fast clock to the slow clock, the normally running CPU (or the system) will turn off the 22 MHz clock, and then switch it to the 32 kHz clock, switching the signal from the 22 MHz to the 32 kHz clock. This is done by selecting the sleep mode to high. In a fast or slow select condition, a select mode signal is sent to NOR gate (270), which initially changes the output to the NOR gate (270) to low and the output to the flip-flop (260) is changed to low.

In circuit A operation, when proceeding from a wake to sleep cycle, in the wake cycle, MUX (380) originally selects sync (321) which is a sampled version of the slow clock (i.e., it selects the B input of MUX (380)).

Though the invention has been described in respect to a specific, preferred embodiment thereof, there are many variations and modifications, which will immediately become apparent to those skilled in the art. It is therefore the intention of the appendicle to be interpreted as broadly as possible in view of the prior art to include all such variations and modifications.

What is claimed is:

1. A device for reducing power consumption, comprising:
   a first clocking device for generating a first clocking signal,
   a second clocking device for generating, a second clocking signal,
   a synchronizer device for receiving the first and second clocking signals and being responsive to a first select signal and to a second control signal wherein upon receipt of either of the first select or second control signals, said synchronizing device generates a synchronized signal without a glitch therefrom wherein said synchronized signal corresponds to either the first or second clocking signals, wherein said synchronizer device is divided into a first bi-stable circuit coupled to a second bi-stable circuit wherein said first bi-stable circuit sends a sync signal to prevent a glitch occurring to the second bi-stable circuit which generates the synchronized signal therefrom.

2. The device of claim 1, further comprising:
   wherein said first bi-stable circuit receiving the first and second clocking signals and being responsive to the first select signal or the second control signal, and
   wherein said second bi-stable circuit receiving the first and second clocking signal and the sync signal outputted from the first bi-stable circuit and being responsive to the first select signal or the second control signal enabling faster switching of either the first or second clocking devices by the generated synchronized signal.

3. The device of claim 2,
   wherein said first bi-stable circuit includes at least a pair of flip-flops including a first flip flop connected to a second flip-flop controlling a logic gate which outputs the synchronized signal wherein said first and second flip-flops act as delay to prevent a metastable switching condition from occurring and the synchronized signal not being outputted.

4. The device of claim 3,
   wherein the first flip-flop is clocked on a rising edge and the second flip flop is clocked on a falling edge.

5. The device of claim 2,
   wherein said first bi-stable device includes a plurality of sets of flip-flops, each set including a first flip-flop connected to a second flip-flop to prevent a metastable switching condition occurring.

6. The device of claim 1
   wherein the second bi-stable device has an exclusive NOR logic gate coupled to at least a single flip-flop responsive to the select signal and synchronized signal enabling faster switching between the slow and fast clocking devices.

7. The device of claim 1,
   wherein said device includes first and second independent modules wherein the first independent module is responsive to the second control signal and has at least one pair of dual flip-flops for generating without glitches said first synchronized signal, and wherein the second independent module receives said first sync signal and the select signal and outputs the synchronized signals therefrom.

8. A device for reducing power usage operable in a wake and sleep mode for an electronic device, comprising:
   a first signal generating device for generating a slow clocking signal;
   a second signal generating device for generating a fast clocking signal;
   a synchronizing device for receiving both the slow clocking signal and the fast clocking signal generating a synchronized signal, when in a wake mode switching from the slow clocking signal to the fast clocking signal by receipt of control signal, and when in a sleep mode switching from the fast clocking signal to the slow clocking, the synchronizing device including first and second independent modules wherein the first independent module to responsive to the control signal and has at least one pair of dual flip-flops for generating without glitches the synchronized signal, and wherein the second independent module outputs the synchronized signals therefrom.

9. A device for reducing power consumption by using a switching circuit for switching between a slow clocking device and a fast clocking, said switching circuit comprising:
   at least first set of dual flip-flops coupled to the slow clock and to the fast clock, and
   a multiplexer device receiving the output of the dual flip-flops and generating a synchronized signal wherein the synchronized signal corresponds to either the fast clocking device or slow clocking device,
   whereupon receipt of an enable signal, the first set of dual flip-flops switches the output of the logic gate to correspond, in a first mode to the fast clocking device, and in a second mode to the slow clocking device.

10. The device according to claim 9,
    wherein upon receipt of the enable signal, the dual flip-flops waiting at least half a cycle to switch the output gate.

11. A method for reducing power consumption, comprising:
    receiving a first clocking signal from a first clocking device;
    receiving a second clocking signal from a second clocking device;
    using a synchronizing means for receiving the first and second clocking signals and responding to a first select signal and to a second control signal wherein upon receipt of either of the select or control signals, the synchronizing means generates a synchronized signal therefrom wherein said synchronized signal corresponds to either the first or second clocking signals; and
    using a first bi-stable circuit coupled to a second bi-stable circuit in the synchronizing means wherein said first bi-stable circuit is responsive to the second bi-stable circuit generating the synchronized signal.

12. The device of claim 11, further comprising:

receiving che first and second clocking signals at the first bi-stable circuit and being responsive to the first select signal or the second control signal, and receiving the first and second clocking signals at the second bi-stable circuit and having an additional sync signal outputted from the first bi-stable circuit and being responsive to the first select signal or the second control signal.

13. The method of claim 11, further comprising:

having at least a pair of flip-flops consisting of a first flip-flop connected to a second flip-flop in the first bi-stable device controlling a logic gate outputting the synchronized signal wherein said first and second flip-flops acting as delay preventing glitches in switching from occurring and the synchronized signal not outputted.

14. The method of claim 11, wherein said first bi-stable device is composed of more than a single set of flip-flops, each set including a first flip-flop connected to a second flip-flop performing multiple switching operations between the fist clocking signal and second clocking signal, and responsive to the first select signal and second control signal such that said switching operations are performed with a delay to prevent a metastable switching condition occurring and the synchronized signal not being outputted.

15. The method of claim 11, wherein the second bi-stable device has an exclusive NOR logic gate coupled to at least a single flip-flop responsive to the select signal.

16. The method of claim 15, wherein the exclusive NOR logic gate is responsive to a third control signal and clocking at a single flip-flop controlling an output multiplexer so as to select the synchronized signal.

17. The mod of claim 16, wherein said synchronizing device is a bi-stable device for receiving the first clocking signal and the second clocking responsive to the second control signal, and generates a first type sync signal as instructed by the second control signal.

18. The method of claim 17, wherein said bi-stable device includes first and second independent modules wherein the first independent module is responsive to the second control signal and has at least one pair of dual flip-flops for generating without glitches said first sync signal, and wherein the second independent module receives said first sync signal and the select signal and outputs the synchronized signals.

* * * * *